(12) United States Patent
Ye et al.

(10) Patent No.: US 10,313,498 B2
(45) Date of Patent: Jun. 4, 2019

(54) ELECTRONIC DEVICE

(71) Applicants: BOE TECHNOLOGY GROUP CO., LTD., Beijing (CN); Chengdu Boe Optoelectronics Technology Co., Ltd., Sichuan Province (CN)

(72) Inventors: Shou Ye, Beijing (CN); Lei Xiao, Beijing (CN); Lijuan Huang, Beijing (CN); Gaoling Zhang, Beijing (CN); Yungchiang Lee, Beijing (CN); Xuan Wen, Beijing (CN); Li Huang, Beijing (CN); Shuang Liu, Beijing (CN); Zhonglong Chen, Beijing (CN); Kai Zhao, Beijing (CN); Qinyuan Chu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 4 days.

(21) Appl. No.: 15/833,066

(22) Filed: Dec. 6, 2017

(65) Prior Publication Data

US 2018/0316783 A1  Nov. 1, 2018

(30) Foreign Application Priority Data

Apr. 26, 2017 (CN) .................... 2017 2 0449488 U

(51) Int. Cl.
| | |
|---|---|
| *H04W 88/02* | (2009.01) |
| *H04M 1/02* | (2006.01) |
| *H04B 1/3827* | (2015.01) |
| *H04M 1/725* | (2006.01) |
| *G06F 1/16* | (2006.01) |
| *G04G 9/00* | (2006.01) |
| *H02S 99/00* | (2014.01) |
| *H01L 31/042* | (2014.01) |

(52) U.S. Cl.
CPC .......... *H04M 1/0245* (2013.01); *G04G 9/007* (2013.01); *G06F 1/163* (2013.01); *G06F 1/1635* (2013.01); *H01L 31/042* (2013.01); *H02S 99/00* (2013.01); *H04B 1/385* (2013.01); *H04M 1/0268* (2013.01); *H04M 1/72563* (2013.01); *H04M 1/72569* (2013.01); *H04M 2201/38* (2013.01); *H04M 2201/42* (2013.01); *H04M 2250/12* (2013.01); *H04M 2250/16* (2013.01)

(58) Field of Classification Search
None
See application file for complete search history.

(56) References Cited

U.S. PATENT DOCUMENTS 5,695,885 A * 12/1997 Malhi ............... H01M 2/10
429/123
9,412,002 B2 * 8/2016 Magi ................ G06K 9/0002
(Continued)

*Primary Examiner* — Tuan A Tran
(74) *Attorney, Agent, or Firm* — Calfee, Halter & Griswold LLP

(57) ABSTRACT

An electronic device includes a wristband comprising a first main surface and a second main surface disposed oppositely; a first display panel and a second display panel which are disposed on the wristband and at least partially facing each other. The first display panel is disposed on the first main surface and the second display panel is a flexible display panel and disposed on the second main surface.

12 Claims, 2 Drawing Sheets

(56) References Cited

U.S. PATENT DOCUMENTS

| | | | |
|---|---|---|---|
| 9,448,755 B2 * | 9/2016 | Francis | G06F 3/1423 |
| 9,531,859 B2 * | 12/2016 | Tan | H04M 1/7253 |
| 9,934,713 B2 * | 4/2018 | Morley | G09G 3/20 |
| 2016/0299526 A1 * | 10/2016 | Inagaki | G02F 1/133305 |

* cited by examiner

ELECTRONIC DEVICE

CROSS REFERENCE

The present application is based upon and claims priority to Chinese Patent Application No. 201720449488.5, filed on Apr. 26, 2017, and the entire contents thereof are incorporated herein by reference.

TECHNICAL FIELD

At least one embodiment of the present disclosure relates to an electronic device.

BACKGROUND

With the approaching of intelligence age and the increasing demand of quality of life for user, the requirement for smart electronic device is increasingly rose for users. As the most representative examples in the field of wearable device, smart phone and smart watch have a lot of collective functions and respective unique features respectively, which causes that choice is hard to be made for users or it is inconvenient for storage.

It is noted that the above disclosed information is merely used for readily understanding the background of the present disclosure, and thus the information that is not well-known to a person skilled in the art can be included herein.

SUMMARY

At least one embodiment of the present disclosure provides an electronic device, which includes:
a wristband including a first main surface and a second main surface disposed oppositely;
a first display panel and a second display panel, which are disposed on the wristband and at least partially facing each other;
wherein the first display panel is disposed on the first main surface and the second display panel is a flexible display panel and disposed on the second main surface.

It is appreciated that the general description above and the detailed description as follow are exemplary and illustrative which do not intend to limit to the scope of the present disclosure.

The summary of the technical implementations and examples described in the present disclosure herein does not include the entire content of the present disclosure and does not equal to the whole scope to be protected of the present disclosure.

BRIEF DESCRIPTION OF THE DRAWINGS

The figures of the embodiments will be described simply for clearly explaining the technical solution of the embodiments of the present disclosure. It is apparent that the figures described as follow merely refer to some of the embodiments of the present disclosure, which do not intend to be limited thereto.

REFERENCE NUMBER

Figure 1:
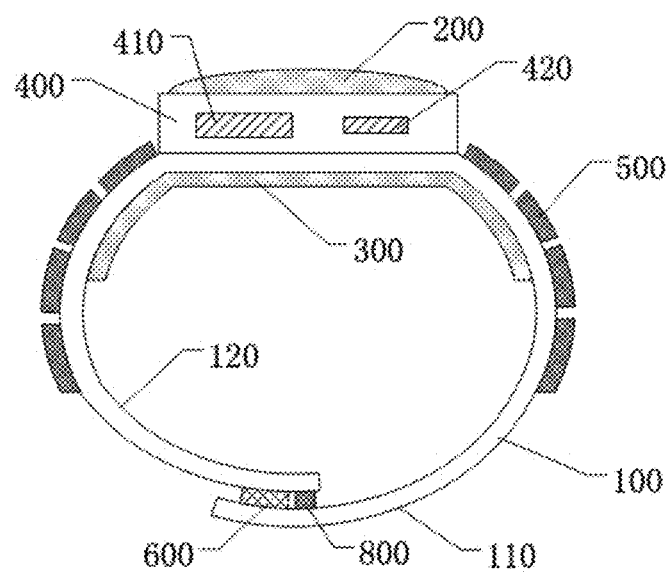
FIG. 1 is a schematic diagram illustrating a structure of an electronic device according to an embodiment of the present disclosure.

100—wristband; 110—first main surface; 120—second main surface; 130—first end; 140—second end; 200—first display panel; 300—second display panel; 400—driving device; 410—control unit; 420—power source; 500—photovoltaic device; 600—magnetic connector; 700—protecting layer; 800—first sensor; 900—second sensor.

DETAILED DESCRIPTION

Hereinafter, implementations of the embodiments of the present disclosure will be described clearly and completely with reference to the drawings of the embodiments of the present disclosure, to make the objectives, implementations and advantages of the embodiments of the present disclosure more clear. Obviously, rather than being all the embodiments, the described embodiments are only part of the embodiments of the present disclosure. All other embodiments available to those skilled in the art without paying any creative labor will fall within the protection scope of the present disclosure.

Unless otherwise defined, all technical or scientific terms used herein are to be interpreted as customary in the art to which the present disclosure belongs. Terms such as "first", "second", and the like used in the description and the claims of the present disclosure do not indicate any order, quantity or importance, instead, they are used to distinguish different components. Likewise, terms such as "include" or "including" or the like refer to that the element or component presented before such terms covers one or more listed elements, components or the equivalent presented after such terms without excluding other elements or components. Terms such as "connect" or "connected with" or the like are not limited to physical or mechanical connection, but may include electrical connection, either directly or indirectly. Terms such as "upper", "lower", "left", "right" and the like are used to indicate relative positional relations, and the relative positional relation will change correspondingly as the absolute position of the described object changes.

Currently, several manufactures have published a variety of smart watches. Such smart watches although have some unique function, for example, some of them are provided with a fashion device, there are still some defects such as simplicity for function, inconvenience for operation, thereby, most of such smart watches needs to be used in cooperation with a smart phone. For example, a smart phone may have most of the function of a smart watch such as displaying the time. In addition, the capability for calculation and storage in a smart phone is stronger than that in a smart watch. Therefore, a smart watch is still used as an accessory for a smart phone. However, there is a problem for a smart phone that it is inconvenient for storage, for example, when a user communicates with others by a smart phone while other work needs to be proceeded, it is inconvenient to deposit the smart phone.

At least one embodiment of the present disclosure provides an electronic device to solve the above problems. The electronic device includes wristband including a first main surface and a second main surface disposed oppositely. The electronic device further includes a first display panel and a second display panel which are disposed on the wristband and at least partially facing each other. The first display panel is disposed on the first main surface and the second display panel is a flexible display panel and disposed on the second main surface. The electronic device can realize different function by using the first display panel and the second display panel, and have display interfaces on both display panels. particularly, the flexible display panel (i.e., the second display panel) allows to have a display interface with a larger size, thereby, the electronic device provides a larger display interface. Since the electronic device can be wore on for example the wrist of the user, the electronic device is convenient for wearing and may allow the user to select a display panel corresponding to the desirable function as needed.

Detailed description will be made to the electronic device provided by the embodiment of the present disclosure with reference to the drawings.

At least one embodiment of the present disclosure provides an electronic device. FIG. 1 is a schematic diagram illustrating a structure of an electronic device according to an embodiment of the present disclosure, and FIG. 2a is a cross-sectional view illustrating the electronic device of FIG. 1 which is in a flat state.

Figure 2A:
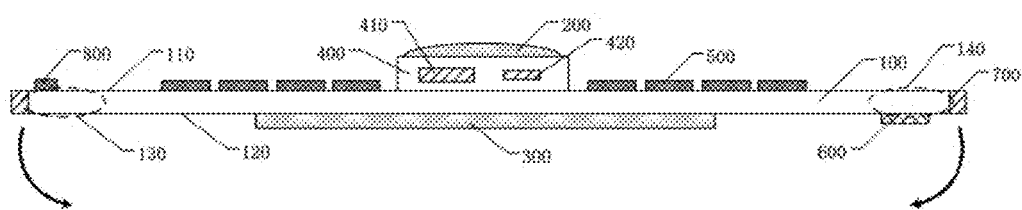
FIG. 2*a* is a cross-sectional view illustrating the electronic device of FIG. 1 which is in a flat state.

For example, as shown in FIGS. 1 and 2a, in the at least one embodiment of the present disclosure, the electronic device may include a wristband 100, a first display panel 200 and a second display panel 300. The wristband 100 includes a first main surface 110 and a second main surface 120 disposed oppositely. The first display panel 200 and the second display panel 300 are disposed on the wristband 100 and at least partially facing each other. The first display panel 200 is disposed on the first main surface 110 of the wristband 100 and the second display panel 300 is a flexible display panel and disposed on the second main surface 120 of the wristband 100. The first display panel 200 may be a liquid crystal display (LCD) panel, an organic light emitting display (OLED) panel, an electronic ink display panel or the like. The second display panel 300 may also be a liquid crystal display (LCD) panel, an organic light emitting display (OLED) panel, an electronic ink display panel or the like.

The electronic device may perform display functions of the first display panel 200 and the second display panel 300, and the first display panel 200 and the second display panel 300 are disposed on both sides of the wristband 100 which are opposite to each other, respectively. The two display panels may perform display function individually and there is no interference between the displayed interfaces of the two display panels, which satisfies the demand for performing different display functions in different scenarios of the users. In addition, the electronic device may be wore on for example a wrist of the user through the wristband 100, which results in that the problem for inconvenience for storage is solved.

In an embodiment of the present disclosure, there is no limitation for the disposed positions of the first display panel 200 and the second display panel 300 on the wristband 100. For example, the first display panel 200 and the second display panel 300 may be disposed on the central part of the wristband 100, or may be biased from the central part of the wristband 100. The disposed position can be determined as needed.

It is noted that there is no limitation for display function and interface setting of the first display panel 200 and the second display panel 300 in the embodiment of the present disclosure, as long as the two display panels can perform display function.

In order to facilitate to illustrate the technical solution of the present disclosure, in the following embodiment, the first display panel 200 is configured to be a display of the watch such as for displaying the graphical user interface (GUI) of the watch and the second display panel 300 is configured to be a display of the mobile phone such as for displaying the GUI of the mobile phone, and the present disclosure is not intend to limit thereto (e.g., the second display panel may be a e-reader). In an embodiment of the present disclosure, for example as shown in FIGS. 1 and 2a, the first display panel 200 may be a display of a watch, and the second display panel 300 may be a display of a mobile phone.

In at least one embodiment of the present disclosure, for example, the electronic device may further include a driving device 400 as shown in FIGS. 1 and 2a. The driving device 400 is communicated with at least one of the first display panel 200 and the second display panel 300; and the driving device 400 may be disposed in one of the first display panel 200 and the second display panel 300, or may be disposed on the wristband 100 individually. At least one of the first display panel 200 and the second display panel 300 may be controlled by the driving device 400 to perform display function. The first display panel 200 and the second display panel 300 are individually configured with a displaying operation system for display, or collectively configured with a displaying operation system for display, and the present disclosure does not intend to limit thereto. In order to facilitate to illustrate the technical solution of the present disclosure, the technical solution in the following embodiments of the present disclosure will be described with reference to an example in which the first display panel 200 and the second display panel 300 are collectively configured with a displaying operation system (i.e., the driving device 400 may control the first display panel 200 and the second display panel 300 simultaneously).

In the embodiment of the present disclosure, for example, the driving device 400 are provided with a control unit 410 and a storage device (not shown). The storage device may be all kinds of memory to store data and/or control instructions. The control unit 410 for example may be a central processing unit or other dedicated processor which can be applied to the first displaying system corresponding to the first display panel 200 and the second displaying system corresponding to the second display panel 300. The control unit 410 may switch from the first displaying system to the second displaying system or from the second displaying system to the first displaying system based on actual needs.

The control unit 410 may be used to switch on or switch off elements. If it is needed to realize more complicated control function, a corresponding circuit may be set up to realize the complicated function. The circuit includes a conventional very large scale integration (VLSI) circuit or a gate array and an existing semiconductor elements, such as a logic chip, a transistor, or other discrete elements. The control unit 410 may further be realized by a programmable hardware device such as a field programmable gate array, a programmable array logic, a programmable logic device or the like.

Currently, power consumption is very high for smart watches or smart phones and batteries has a restricted capacity and is not convenient for being charged, therefore, the endurance of batteries is not sufficient for some situations such as outdoor use and the batteries always runs out in such situations.

In the embodiment of the present disclosure, for example, the electronic device may further include a photovoltaic device 500 disposed on the first main surface 110 of the wristband 100 as shown in FIGS. 1 and 2*a*. The photovoltaic device 500 is configured to supply power to the driving device 400 and/or the first display panel and the second display panel. When a user uses the electronic device outdoors, the photovoltaic device may improve the endurance of the electronic device by converting solar energy into electricity. For example in the embodiment, the driving device 400 of the electronic device may further include a power source 420. The power source 420 may be electrically connected with the photovoltaic device 500, and store the electricity generated by the photovoltaic device 500 or supply the electricity generated by the photovoltaic device 500 to other power consumption structure in the driving device such as control unit 410 and the like. The power source 420 may be for example a secondary battery such as a lithium ion battery.

Figure 2B:
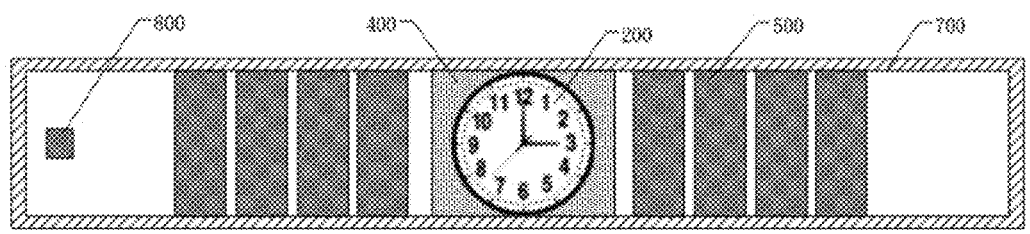
FIG. 2*b* is a top view illustrating the electronic device of FIG. 2*a*.

For example in at least one embodiment of the present disclosure, FIG. 2*b* is a top view illustrating the electronic device of FIG. 2*a*. As shown in FIG. 2*b*, the photovoltaic device 500 may include a plurality of sub-photovoltaic panels which are disposed on at least one side of the first display panel 200 in parallel. For example when a user wears the electronic device, the wristband 100 will be bent. Since the photovoltaic device 500 is composed of the plurality of sub-photovoltaic panels, the damage caused by bending can be avoid for the photovoltaic device 500. These sub-photovoltaic panels may be any suitable solar cell, such as an a-Si-based solar cell. The sub-photovoltaic panels may be connected with each other in series, in parallel or in multiple-series.

For example, the sub-photovoltaic panels may be disposed on one side of the first display panel 200, such as the left side or right side in lateral, or may be disposed on both sides of the first display panel 200. The present disclosure does not intend to limit to the disposed position and the number for the sub-photovoltaic panels as long as the sub-photovoltaic panels can receive solar energy and supply electricity to the driving device 400.

For example in at least one embodiment of the present disclosure, the wristband 100 may include a first end 130 and a second end 140 which are distal to the first display panel 200 as shown in FIG. 2*a*. The wristband 100 is configured such that the first end 130 and the second end 140 are connected detachably For example in the embodiment of the present disclosure, the connection manner for the first end 130 and the second end 140 of wristband 100 may include at least one of magnetic connecting, fastening and clamping. For example in at least one embodiment of the present disclosure, the first end 130 and the second end 140 of wristband 100 may be detachably connected with each other by a magnetic connector 600 as shown in FIGS. 1 and 2*a*. The magnetic connector 600 may be disposed on the first end 130 and/or the second end 140 and there is no limitation for the disposed position and the number of the magnetic connector 600 in the present disclosure as long as the magnetic connector 600 can connect the first end 130 with the second end 140. For example, when the material of the wristband 100 is a non-metallic material, both the first end 130 and the second end 140 may be provided with a magnetic connector 600.

It is noted that there is no limitation for the connection manner of the first end 130 and the second end 140 of the wristband 100 in the present disclosure. Any suitable manner that can detachably connect the first end 130 with the second end 140 of the wristband 100 may be applied to the technical solution of the present disclosure.

For example in the embodiment of the present disclosure, the material of the wristband 100 may be a shape memory material such as a metallic memory material which can be realize by the shape memory materials that is currently well known. When the material of the wristband 100 is a shape memory material, the initial memory shape of the wristband 100 can be set as a flat state, that is to say, the first main surface 110 and the first main surface 120 of the wristband 100 are continuous horizontal planes. After the first end 130 and the second end 140 of the electronic device are dismantled, the wristband 100 may return to the flat state automatically to facilitate to operate the second display panel 300.

It is noted that the material of the wristband 100 is not be restricted as the above materials in the present disclosure, and the material of the wristband in the present disclosure may be the same as that of the existing watches, such as nylon, leather, rubber, fabric, metal or the like, and there is no limitation for the material of the wristband 100 in the present disclosure.

When a user uses the electronic device provided by the embodiment of the present disclosure, different functions may be needed in different scenarios. For example, when a user wears the electronic device, the first display panel 200 may be needed to operate, that is, the electronic device is needed to operate as a watch; for example, when a user may need the second display panel 300 to operate, the first end 130 and the second end 140 of the electronic device may be detached, that is, the electronic device is needed to operate as a mobile phone.

For example in at least one embodiment of the present disclosure, the electronic device may further include a first sensor 800 disposed on at least one of the first end 130 and the second end 140 of the wristband 100. The first sensor 800 is configured to detect the connection state between the first end 130 and the second end 140, and signally communicate with the driving device 400. The first sensor 800 may detect the connection state between the first end 130 and the second end 140 and send the detected signal to driving device 400 in real time. For example, the first sensor 800 send the detected signal to the control unit 410 in the driving device 400 and the control unit 410 may determine the connection state between the first end 130 and the second end 140 according to the detected signal, and subsequently may perform shifting between the first displaying system and the second displaying system. Thereby, the electronic device can shift from the mobile phone mode to the watch mode or from the watch mode to the mobile phone mode based on the user's needs.

For example in at least one embodiment of the present disclosure, the driving device 400 may be configured to turn on the first display panel 200 and turn off the second display panel 300 when the first end 130 is connected with the second end 140; and the driving device 400 may be configured to turn on the second display panel 300 and turn off the first display panel 200 when the first end 130 is not connected with the second end 140. The connection state between the first end 130 and the second end 140 can be detected by the mentioned first sensor 800. As such, when the user wears the electronic device, the electronic device can shift to the watch mode; and when the user needs the second display panel 300 to perform display function, the user detaches the first end 130 and the second end 140 of the wristband 100, and the electronic device then shift to the mobile phone mode, which is convenient for operation.

Figure 2C:
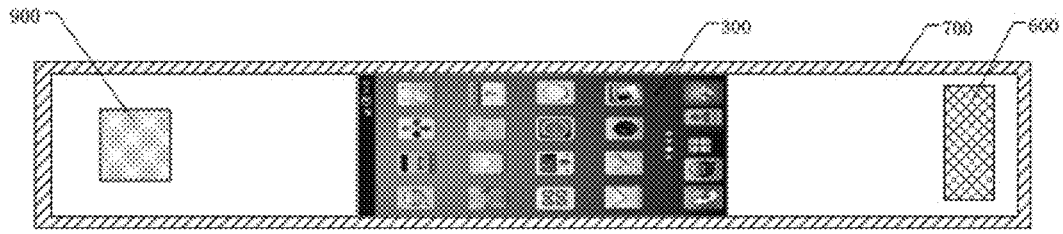
FIG. 2*c* is a bottom view illustrating the electronic device of FIG. 2*a*.

For example in at least one embodiment of the present disclosure, FIG. 2c is a bottom view illustrating the electronic device of FIG. 2a. As shown in FIG. 2c, the electronic device may further include a second sensor 900 disposed on the second main surface 120 of the wristband 100. For example, the second sensor 900 may be configured to detect pulse rate, body temperature and the like, and the second sensor 900 may be signally communicated with the driving device 400. For example, the driving device 400 can displayed information detected by the second sensor 900 on the first display panel 200 or the second display panel 300. For example, when the user wears the electronic device, the information for the user such as pulse rate, body temperature and the like can be displayed on the first display panel 200 in real time, so as to realize the real-time detection for user's health.

For example in at least one embodiment of the present disclosure the electronic device may further include a protecting layer 700 disposed on a side surface around the wristband 100. For example, the protecting layer 700 may be a flexible layer such as silicone layer, which functions as protection for the electronic device and improves comfortability when the user wears the electronic device. For example, the protecting layer 700 can be disposed on all side surface of the electronic device.

The structure of the electronic device provided by the embodiment of the present disclosure is not limited to be the above embodiments. The respective structures in the electronic device can be designed as needed. Other functional modules can be added into the electronic device. The embodiment of the present disclosure does not intend to limit thereto.

Figure 3:
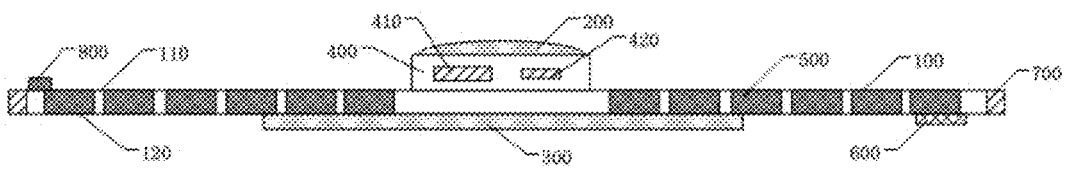
FIG. 3 is a cross-sectional view illustrating another electronic device according to an embodiment of the present disclosure.

FIG. 3 is a cross-sectional view illustrating another electronic device according to an embodiment of the present disclosure. For example, in at least one embodiment of the present disclosure, as shown in FIG. 3, the photovoltaic device 500 may be embedded into the wristband 100, as long as the light can be incident on the sub-photovoltaic panels. As such, the thickness of the electronic device at the wristband 100 can be decreased, and the wristband 100 can protect the photovoltaic device 500. Accordingly, the photovoltaic device 500 is prevented from being damaged by friction, collision or the like when being disposed on the first main surface 110.

Figure 4:
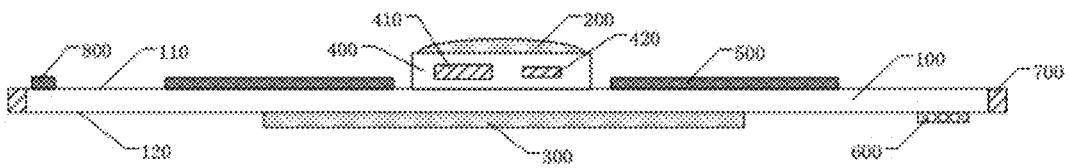
FIG. 4 is a cross-sectional view illustrating another electronic device according to an embodiment of the present disclosure.

FIG. 4 is a cross-sectional view illustrating another electronic device according to an embodiment of the present disclosure. For example, in at least one embodiment of the present disclosure, as shown in FIG. 4, the photovoltaic device 500 may include at least one flexible photovoltaic panel which may be disposed on at least one side of the first display panel 200. When the user wears the electronic device, since the photovoltaic device 500 is flexible photovoltaic panel, there is no need to worry about that the photovoltaic device 500 is bent and damaged. When the photovoltaic device 500 is flexible photovoltaic panel, the photovoltaic device 500 may be disposed on one side of the first display panel 200 or both sides of the first display panel 200.

Figure 5:
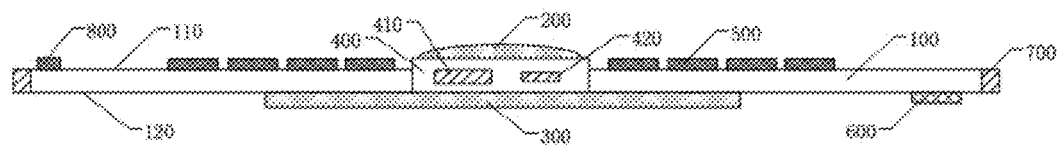
FIG. 5 is a cross-sectional view illustrating another electronic device according to an embodiment of the present disclosure.

FIG. 5 is a cross-sectional view illustrating another electronic device according to an embodiment of the present disclosure. For example, in at least one embodiment of the present disclosure, as shown in FIG. 5, the driving device 400 may be disposed in the wristband 100. As such, the overall thickness of the electronic device can be decreased.

The electronic device provided by the embodiment of the present disclosure may further include another functional module. For example, in at least one embodiment of the present disclosure, the electronic device may further include at least one of or combination of a key for answering phone call, a key for controlling volume, a key for displaying image and a key for playing video which is disposed on one of the first display panel or the second display panel.

For example, in at least one embodiment of the present disclosure, the electronic device may further include a speaker, a microphone, a charging interface, an earphone jack and the like which can be disposed on the wristband 100 or the driving device 400, and the position for the mentioned additional components and structures can be determined as needed. For example, components such as the speaker, the microphone or the like may be disposed on the second main surface 120 of the wristband 100 and may be disposed on the position of the second main surface 120 which is not covered by the second display panel 300.

For example, in at least one embodiment of the present disclosure, the electronic device may further include at least one of or combination of a gravity sensor, a distance sensor, a positioning device and a light sensor to satisfy user's demand for intelligence of the electronic device.

For example, in at least one embodiment of the present disclosure, the first display panel 200 and/or the second display panel 300 of the electronic device may be any type of the display panel having display function.

For example, one example of such display panel is liquid crystal display panel which includes an array substrate and a counter substrate, the array substrate and the counter substrate are aligned with each other to form a liquid crystal cell in which liquid crystal materials are filled. The counter substrate may be for example a color-filter substrate. The pixel electrode of each pixel unit in the array substrate is used for applying of electric field to control the rotation degree of liquid crystal materials, so as to perform displaying operations.

For example, another example of such display panel is an organic light emitting diode (OLED) display panel. In the OLED display panel, a stack of organic materials is formed on the array substrate and the anode and the cathode of each pixel are used for driving the organic materials to emit light, so as to perform displaying operations.

For example, another example of such display panel is an electronic paper display panel. In the electronic paper display panel, an electronic ink layer is formed on the array substrate and the pixel electrode of each pixel unit is used for applying voltage to drive electrically charged particle in the electronic ink to move, so as to perform displaying operations.

For example, in at least one embodiment of the present disclosure, the first display panel 200 and/or the second display panel 300 may be configured to be a display panel having a touch function. For example, the first display panel 200 and/or the second display panel 300 may be provided with a touch panel. For example when the electronic device is wore, the touch function of the second display panel 300 may be turned off. For example, in at least one embodiment of the present disclosure, the shapes of the first display panel 200 and/or the second display panel 300 may be rectangle, circle, triangle, polygon or the like and the present disclosure does not intend to limit thereto.

The electronic device provided by the embodiments of the present disclosure may have at least one of the following effects.

The electronic device provided by at least one embodiments of the present disclosure may have a display function of a mobile phone and a display function of a watch at the same time, and may perform shifting between two modes based on user's need, which results in that the electronic device have richer functions and are more portable.

In the electronic device provided by at least one embodiments of the present disclosure, since the photovoltaic device is added, the endurance of the electronic device is improved.

For the present disclosure, the following things should be noted.

The drawings of the embodiments of the present disclosure merely refers to the structure related to the embodiments of the present disclosure, and other structures can refer to the general design.

For the sake of clarity, in the drawings for illustrating the embodiments of the present disclosure, the thicknesses of layers and regions are enlarged or reduced, that is, these drawings are not drawn according to the actual scale.

The features in the embodiments of the present disclosure may be combined with each other to obtain a new embodiment if they are not conflicted.

The electronic device provided by at least one embodiment of the present disclosure may have display interfaces and corresponding functions of two display panels. The electronic device is more portable since the electronic device can be wore on for example the wrist of the user and may allow the user to select desired display panel as needed.

The above embodiments are merely the specific implementations and the scope of the present disclosure is not limited thereto. The actual scope protected by the present disclosure shall be referred to the scope protected by claims.

What is claimed is:

1. An electronic device, comprising:
   a wristband, comprising a first main surface and a second main surface disposed oppositely, wherein in a case where the wristband is worn on a user's wrist, the first main surface is a surface away from the user's wrist, and the second main surface is a surface facing the user's wrist;
   a first display panel and a second display panel, both disposed on the wristband and at least partially facing each other;
   a driving device, disposed on the wristband;
   a first end and a second end which are distal to the first display penal, the wristband being configured such that the first end and the second end are connected detachably;
   a first sensor disposed on at least one of the first end and the second end,
   wherein the first display panel is disposed on the first main surface, and wherein the second display panel is a flexible display panel and is disposed on the second main surface,
   wherein the driving device is communicated with at least one of the first display panel and the second display panel,
   wherein the first sensor is configured to detect the connection state between the first end and the second end, and is signally communicate with the driving device, and
   wherein the driving device is configured to turn on the first display penal and turn off the second display penal when the first end is connected with the second end, and the driving device is configured to turn on the second display penal and turn off the first display penal when the first end is not connected with the second end.

2. The electronic device according to claim 1 further comprising:
   a photovoltaic device, disposed on the first main surface of the wristband,
   wherein the photovoltaic device is configured to supply power to the driving device.

3. The electronic device according to claim 2, wherein the photovoltaic device comprises a plurality of sub-photovoltaic panels which are disposed on at least one side of the first display panel in parallel; or
   the photovoltaic device comprises at least one flexible photovoltaic panel which is disposed on at least one side of the first display panel.

4. The electronic device according to claim 2, wherein the photovoltaic device is embedded into the wristband.

5. The electronic device according to claim 1 wherein the wristband is composed of a shape memory material.

6. The electronic device according to claim 1, wherein the first end and the second end are connected with each other in the manner of at least one of magnetic connecting, fastening and clamping.

7. The electronic device according to claim 1 further comprising:
   a second sensor disposed on the second main surface;
   wherein the second sensor is configured to detect at least one of pulse rate and body temperature and the second sensor is signally communicated with the driving device.

8. The electronic device according to claim 1 further comprising:
   a protecting layer disposed on a side surface around the wristband.

9. The electronic device according to claim 1 further comprising:
   at least one of or combination of a key for answering phone call, a key for controlling volume, a key for displaying image and a key for playing video which is disposed on one of the first display panel or the second display panel.

10. The electronic device according to claim 1, wherein the first display panel is configured to display a graphical interface of a watch; and
    the second display panel is configured to display a graphical interface of a mobile phone.

11. The electronic device according to claim 10 further comprising:
    at least one of or combination of a gravity sensor, a distance sensor, a positioning device and a light sensor.

12. An electronic device, comprising:
    a wristband, comprising a first main surface and a second main surface disposed oppositely;
    a first display panel and a second display panel, both disposed on the wristband and at least partially facing each other;
    a driving device, disposed on the wristband;
    a first end and a second end which are distal to the first display penal, the wristband being configured such that the first end and the second end are connected detachably;
    a first sensor disposed on at least one of the first end and the second end, wherein the first display panel is disposed on the first main surface, and wherein the second display panel is a flexible display panel and is disposed on the second main surface, wherein the driving device is communicated with at least one of the first display panel and the second display panel, wherein the first sensor is configured to detect the connection state between the first end and the second end, and is signally communicate with the driving device, and wherein the driving device is configured to turn on the first display penal and turn off the second display penal when the first end is connected with the second end, and the driving device is configured to turn on the second display penal and turn off the first display penal when the first end is not connected with the second end.

* * * * *